United States Patent [19]  [11] 4,044,372
Weinstein  [45] Aug. 23, 1977

[54] PHOTOVOLTAIC CELL HAVING CONTROLLABLE SPECTRAL RESPONSE

[75] Inventor: Harold Weinstein, Sherman Oaks, Calif.

[73] Assignee: Sensor Technology, Inc., Chatsworth, Calif.

[21] Appl. No.: 494,764

[22] Filed: Aug. 5, 1974

[51] Int. Cl.² .......................................... H01L 27/14
[52] U.S. Cl. ...................................... 357/30; 357/63; 357/64; 357/89; 357/90; 357/29; 148/186; 148/1.5
[58] Field of Search .................. 357/30, 63, 64, 31, 357/89, 90, 4, 29

[56] References Cited
U.S. PATENT DOCUMENTS

| 3,413,145 | 11/1968 | Robinson | 117/201 |
|---|---|---|---|
| 3,414,434 | 12/1968 | Manasevit | 117/201 |
| 3,418,473 | 12/1968 | Blue | 250/83.3 |
| 3,440,113 | 5/1969 | Wolley | 148/187 |
| 3,443,102 | 5/1969 | Kaye | 250/211 |
| 3,462,311 | 8/1969 | Ross | 136/89 |
| 3,515,576 | 6/1970 | Manasevit | 117/106 |
| 3,728,592 | 4/1963 | Joshi | 317/235 R |

Primary Examiner—Martin H. Edlow
Attorney, Agent, or Firm—Flam & Flam

[57] ABSTRACT

The spectral response of a photovoltaic cell is controlled by modifying the minority carrier transport characteristics of the cell semiconductor body. Recombination centers are provided in the body that reduce the lifetime or diffusion distance of minority carriers. Thus a reduced percentage of minority carriers produced deep in the body by absorption of relatively long wavelength photons reach the cell junction, as compared with carriers produced at lesser depth by absorption of shorter wavelength photons. The result is a shift in the peak spectral response of the cell toward shorter wavelengths.

6 Claims, 2 Drawing Figures

PHOTOVOLTAIC CELL HAVING CONTROLLABLE SPECTRAL RESPONSE

BACKGROUND OF THE INVENTION

1. Field of the Invention

The present invention relates to photovoltaic cells having controllable spectral response.

2. Description of the Prior Art

A photovoltaic cell typically consists of a semiconductor body in which a shallow P-N junction has been produced. When light strikes the device, a current is produced across the junction that is proportional to the intensity of the light source. However, the response characteristics of a photovoltaic cell vary with the wavelength of the incident light. Thus, the cell may produce a certain short-circuit current when illuminated with light at say 600 nanometers (nm), and produce a much higher output current when illuminated with light of the same intensity, but at a wavelength of 900 nm.

The spectral response characteristics of a typical prior art silicon photovoltaic cell are illustrated by the curve 10 of FIG. 1. The response at 900 nm is more than twice that at 500 nm. As described below, these typical spectral characteristics are governed by the silicon band gap structure, and by the light absorption properties of the material. Because of this, in the past it has been difficult to produce photovoltaic cells of altered spectral properties. A principal object of the present invention is o provide a photovoltaic cell having a predetermined, controllable spectral response.

The mechanism by which an output current is produced in a photovoltaic cell involves interaction of the incident light photons with the semiconductor silicon material of the cell. Absorption of a photon by a valence electron in a silicon atom raises that electron to the conduction band and creates a hole-electron pair. In silicon, interaction with a phonon may be required to produce the hole-electron pair as part of a three-particle interaction. The minority carriers (e.g., holes in N-type material) flow to the semiconductor junction, where they are "collected" and add to the output current.

The depth at which the hole-electron pair production occurs depends on the wavelength of the incident light. Specifically, when radiant flux of intensity $I_o$ falls upon the surface of a P-N junction device, it will be absorbed according to the relationship:

$$I = I_o e^{-\alpha x}$$

where I is the intensity at any distance $x$ from the surface, assuming that $I_o$ is the intensity after surface reflection and scattering losses have been substracted from the incident beam. The exponential term $\alpha$ is the absorption coefficient, which is a function of the cell material and of the wavelength of the incident radiation.

An illustrative curve 11 showing the absorption coefficient $\alpha$ as a function of wavelength $\lambda$ for a semiconductor material is shown in FIG. 2. From this it can be seen that the absorption coefficient at the short wavelength end is extremely high. In silicon, at about 350 nm almost all absorption takes place within only a few atoms depth from the surface. Unavoidable surface imperfections in the silicon cause a high order or recombination to occur. That is, as soon as the photon is absorbed to produce a whole-electron pair, recombination of this pair takes place. As a result of this recombination, negligibly few minority carriers reach the cell junction. Output current is very small. This accounts for the low cell output (see FIG. 1) at short wavelengths.

At increasingly longer wavelengths, the photons penetrate further into the silicon body of the cell. The major factor contributing to the spectral response characteristics at such longer wavelengths is the ability of the semiconductor material to translate internal quantum efficiency into external output via charge carrier transport to the P-N junction. In high mobility silicon, a large percentage of the minority carriers produced by photon absorption will be able to diffuse to the junction and add to the output current.

At wavelengths longer than about 900 nm, the minority carrier diffusion length in silicon begins to limit the percentage of minority carriers that reach the P-N junction. As a result, the spectral response of the photocell begins to decline above this value (see FIG. 1). The upper wavelength limit of photocell response is set by the band gap of silicon. Thus photons with an energy of greater than about 1.12 electron volts will be unable to raise the valence electron of a silicon atom up to the conduction band. This photon energy corresponds to a wavelength of about 1100 nm, which is the upper limit of cell response.

For many applications, photocell spectral response other than that shown in FIG. 1 is preferred. Thus, e.g., for some applications a photosensor having a spectral response corresponding to that of the human eye may be required. Human vision has a peak response at about 550 nm, and decreases rapidly above that value to the cut-off wavelength which is below about 700 nm. Photosensors having other spectral response peaks may be needed for special color detection applications such as colorimetry, flame spectroscopy, spectrometry and the like.

In the past, a few techniques have been available to alter selectively the spectral response of a photovoltaic cell. For example, the short wavelength response may be increased by bringing the P-N junction very close to the surface, and by improving the quality of the silicon surface so that is has fewer imperfections.

Another known technique for modifying spectral response is the use of optical filters external to the silicon body itself. Such a filter may comprise a layer or coating of material deposited directly onto the cell surface. A filter film acts to reduce the transmission of radiant flux into the cell at certain wavelengths. While such optical filters do achieve the desired purpose, they have the disadvantage of high cost. Moreover, the coatings tend to wear off and/or to degrade with time, so that over a few months or years the sprectral response of the optical filter cell may vary considerably from its original value. Another object of the present invention is to provide means for selectively altering the spectral response of a photovoltaic cell without the use of an optical filter.

SUMMARY OF THE INVENTION

These and other objectives are achieved by providing a semiconductor photovoltaic cell in which the spectral response is controlled selectively by modification of the semiconductor cell material so as to alter the minority carrier lifetime or diffusion distance. As a result, the contribution to the output current made by minority carriers resultant from absorption of longer wavelength photons is reduced. The effect is to shift the peak spectral response of the photocell toward shorter wavelengths.

In certain embodiments of the present invention, this is achieved by selective gold doping of the silicon. The gold dopant provides recombination centers at which electron-hole recombination occurs. The gold dopant concentration and gradiant can be selected to achieve minority carrier lifetimes and diffusion distances of particular value. For example, the diffusion distance may be controlled so that the only minority carriers which reach the P-N junction are those resultant from absorption of photons having a wavelength above a selected value. By controlling the gold dopant gradiant, the relative response of the cell to different wavelengths also can be controlled.

In another embodiment, the minority carrier lifetime or diffusion distance may be decreased by producing lattice defects and other imperfections within the body of the semiconductor material. For example, high energy electron bombardment may be used to produce recombination centers within the cell.

BRIEF DESCRIPTION OF THE DRAWINGS

A detailed description of the invention will be made with reference to the accompanying drawings wherein like numerals designate corresponding elements in the several figures.

DESCRIPTION OF THE PREFERRED EMBODIMENTS

The following detailed description is of the best presently contemplated modes of carrying out the invention. This description is not to be taken in a limiting sense, but is made merely for the purpose of illustrating the general principles of the invention since the scope of the invention best is defined by the appended claims.

Operational characteristics attributed to forms of the invention first described also shall be attributed to forms later described, unless such characteristics obviously are inapplicable or unless specific exception is made.

Figure 3:
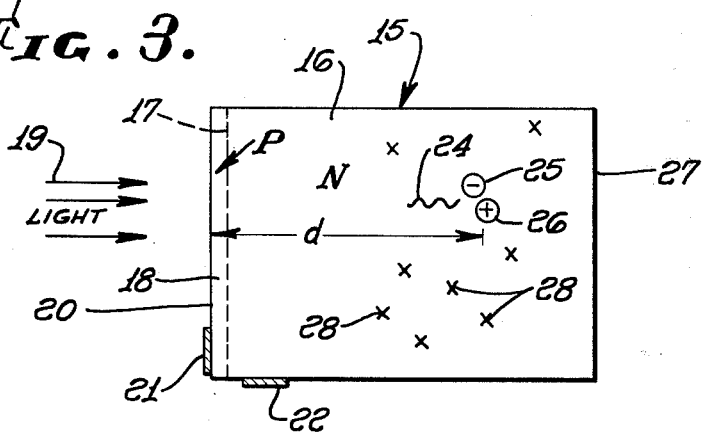
FIG. 3 is a diagrammatic view of a photovoltaic cell in accordance with the present invention wherein gold doping is used to control the spectral response.

The photovoltaic cell 15 of FIG. 3 comprises a body of 16 of N-type silicon semiconductor material. A very shallow junction 17 is formed in the body 16 by diffusion of a P-type dopant into a surface-adjacent region 18. The depth of the junction 17 normally is less than about one micron. When length (indicated by the arrows 19 of FIG. 3) is incident upon the front face 20 of the device 15, a current is produced across the junction 17. This current may be supplied as an output to utilization circuitry (now shown) via electrodes 21 and 22 on opposite sides of the junction 17.

As discussed above, the depth to which photons of the light 19 will penetrate into the cell body 16 is a function of wavelength. At relatively short wavelengths, the photons that pass through the surface 20 will not penetrate very far, however, photons of longer wavelength will penetrate deep into the body 16. In either case, photon absorption will result in hole-electron pair production at a depth established by the wavelength. Thus as indicated diagrammatically in FIG. 3, a photon 24 of some particular wavelength will be absorbed to form an electron 25 and a hole 26 at some certain depth $d$ measured from the front face 20. The hole 26 or minority carrier will migrate toward the junction 17 where it is "collected" and adds to the external current. Obviously, for longer wavelength light 19, the depth $d$ and hence the distance which the minority carrier must travel to the junction 17 will be increased.

In accordance with one embodiment of the present invention, the spectral response of the device 15 is altered by doping the region 16 with gold. This may be accomplished by diffusion of gold through the rear face 27. As is known per se, gold dopant atoms function in a semiconductor as recombination centers or traps for minority carriers. Such recombination centers are indicated diagrammatically by the crosses 28 in FIG. 3. When a minority carrier (e.g., a hole 26) reaches such a center 28, recombination occurs and the minority carrier ceases to exist per se.

Figure 1:
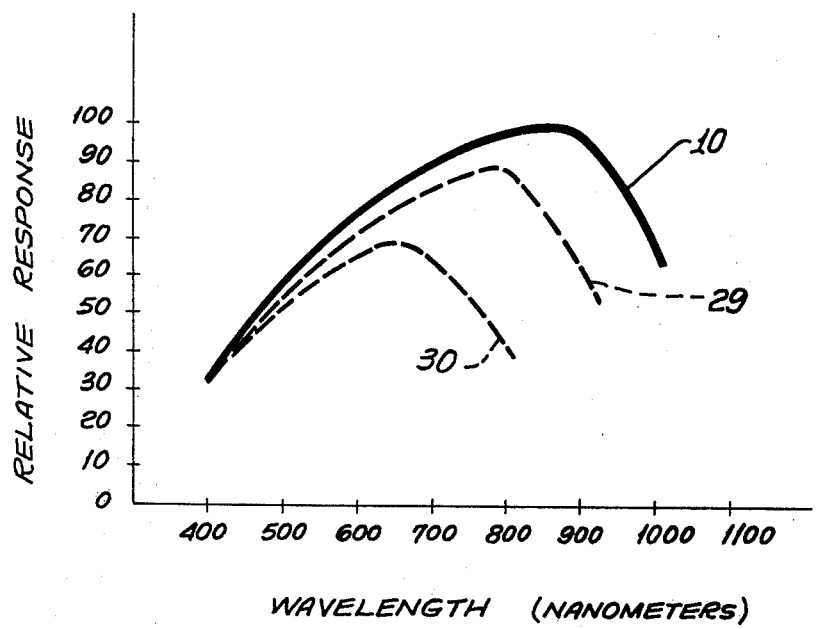
FIG. 1 is a graph showing typical spectral response curves for a prior art silicon photovoltaic cell and for several illustrative embodiments of the present invention.
Figure 2:
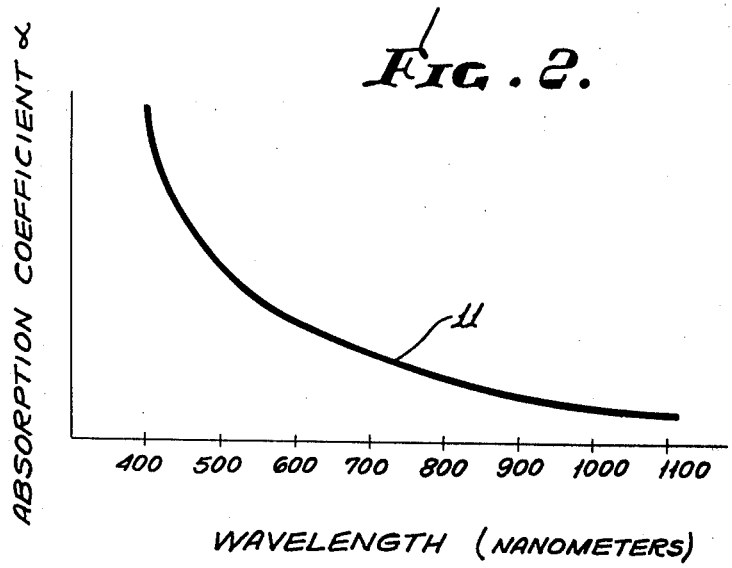
FIG. 2 is a graph of absorption coefficient as a function of wavelength for silicon.

If the silicon 16 is of high mobility, and relatively free of lattice imperfections and other defects, the mean free path of diffusion distance of the minority carriers 26 is relatively large. However, the addition of gold dopant recombination centers 28 substantially reduces the average diffusion distance or lifetime of the minority carriers. The greater the dopant concentration, the shorter will be this diffusion distance. Thus, if the gold dopant concentration is relatively low, the minority carrier diffusion length will be reduced only slightly. Minority carriers produced by absorption of photons of relatively short wavelength (and hence relatively small depth of penetration $d$) will almost all reach the junction 17. However, minority carriers 26 produced by photons of longer wavelength (and hence greater penetration depth $d$) will not reach the junction 17. Before they have travelled this far, they will have reached a trap 28 and have been recombined. The net result is a shift in the spectral response of the device 15 toward shorter wavelengths, as indicated by the curve 29 of FIG. 1. A greater gold dopant concentration will result in an even further spectral shift, as indicated by the curve 30 of FIG. 1.

The gold dopant concentration in the device 15 need not be uniform. Rather, the dopant concentration or density of recombination centers 28 may itself be a linear or non-linear function of depth $d$ measured from the front face 20. Specific spectral response characteristics can be achieved by judicious control of the gold dopant gradient.

Figure 4:
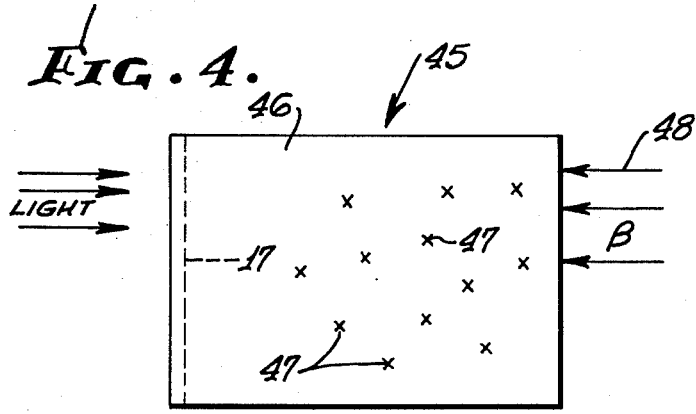
FIG. 4 is a diagrammatic view of another photosensor in accordance with the present invention, wherein lattice and other defects produced by beta bombardment function as recombination centers that effectively shift the spectral response of the cell toward shorter wavelengths.

In the photosensor 45 of FIG. 4, the spectral response is altered by producing lattice defects for other imperfections within the silicon semiconductor body 46. Such defects, indicated by the crosses 47, function as recombination centers that trap the minority carriers. Thus the manner in which the spectral response is shifted is analogous to that described above in the connection with FIG. 3.

Advantageously, the recombination centers 47 are produced by beta bombardment of the device 45 through the rear surface 27. To this end, beta particles (electrons) are accelerated toward the device 45 with an energy typically on the order of 750 keV. These particles, indicated by the arrows 48, penetrate into the silicon 46 where they create lattice defects. For example, such beta bombardment may knock silicon atoms out of their usual lattice position and into interstitial locations. Such lattice defects act as traps at which photon-induced minority carriers will be recombined.

Since the substrate 57 is an insulative material, there is no minority carrier contribution to the output current. Thus, the spectral response is determined by the thickness 56. This can be controlled in a known manner by depositing or growing this semiconductor layer 56 epitaxially on the semiconductor substrate to a controlled thickness appropriate to produce the desired spectral response.

Intending to claim all novel, useful and unobvious features shown as described the applicant claims:

1. A photovoltaic cell having preselected spectral response, comprising;
    a semiconductor body,
    a shallow junction in said body adjacent the front face thereof, and
    means modifying the minority carrier transport properties of said body to decrease the percentage of minority carriers, produced by absorption of photons of relatively long wavelength within said body, that reach said junction, so that the peak spectral response of said cell is shifted toward shorter wavelengths, said modifying means comprising recombination centers for said minority carriers in said body.

2. A photovoltaic cell according to claim 1 wherein said recombination centers consist of beta-bombardment-induced lattice defects in said semiconductor.

3. A photovoltaic cell according to claim 1 wherein said recombination centers consist of gold dopant atoms in said semiconductor, said gold having a gradient of increasing dopant concentration with increasing distance into said body as measured from said shallow junction.

4. In a photovoltaic cell of the type having a shallow junction adjacent the front face of a semiconductor body, the process for altering the spectral response characteristics of said cell comprising;
    modifying the minority carrier transport characteristics of said body so that the percentage of the minority carriers produced by relatively long wavelength photon absorption deep in said body reaching said shallow junction is reduced relative to the percentage of minority carriers produced by relatively shorter wavelength photon absorption at lesser depths in said body, and wherein said modifying comprises producing recombination centers in said body.

5. A process according to claim 4 wherein said producing consists of bombarding said body with high energy electrons to produce defects in said semiconductor body, said defects acting as recombination centers for said minority carriers.

6. A process according to claim 4 wherein said producing consists of doping said semiconductor body with gold atoms by diffusion through the rear face of said body, said gold atoms acting as recombination centers for said minority carriers.

* * * * *